United States Patent [19]

McLeod

[11] Patent Number: 5,179,359
[45] Date of Patent: Jan. 12, 1993

[54] DIGITALLY CONTROLLED FREQUENCY GENERATOR INCLUDING A CRYSTAL OSCILLATOR

[75] Inventor: Scott C. McLeod, Canoga Park, Calif.

[73] Assignee: Hughes Aircraft Company, Los Angeles, Calif.

[21] Appl. No.: 851,724

[22] Filed: Mar. 16, 1992

[51] Int. Cl.$^5$ .............................................. H03B 21/02
[52] U.S. Cl. ....................................... 331/38; 331/40; 331/42; 331/47; 331/48
[58] Field of Search ....................... 331/37, 38, 40, 42, 331/46, 47, 48

[56] References Cited

U.S. PATENT DOCUMENTS 4,344,046 8/1982 Zumsteg .............................. 331/37 X
4,831,339 5/1989 Nemeth .............................. 331/46 X

*Primary Examiner*—Siegfried H. Grimm
*Attorney, Agent, or Firm*—R. M. Heald; C. D. Brown; W. K. Denson-Low

[57] ABSTRACT

A digitally controlled oscillator (100) having a first oscillator circuit (108) for providing an oscillator signal $F_o$ of a defined frequency and a digital divider (110) for dividing the oscillator signal $F_o$ by a selectable number controlled by a digital word for providing a clock signal $F_{clk}$. A second oscillator circuit (104) receives the clock signal $F_{clk}$ and provides a low frequency signal $F_c$. The second oscillator circuit includes a digitally controlled resonator element (112) for determining the frequency of the low frequency signal and has a center frequency dependent upon the clock signal. Circuitry (118, 120, 138) is included for providing first and second pairs of quadrature phase shifted signals derived from the clock signal $F_{clk}$ and the low frequency signal $F_c$ and from the oscillator signal $F_o$, respectively. Finally, a mixer (136) is provided for mixing the first and second pairs of quadrature phase shifted signals for providing a single high frequency output signal $F_{out}$ which varies in accordance with the digital word.

21 Claims, 2 Drawing Sheets

DIGITALLY CONTROLLED FREQUENCY GENERATOR INCLUDING A CRYSTAL OSCILLATOR

BACKGROUND OF THE INVENTION

1. Field of the Invention

The present invention relates to crystal oscillators. More specifically, the present invention relates to high accuracy, low noise, digitally controlled crystal oscillators.

While the present invention is described herein with reference to illustrative embodiments for particular applications, it should be understood that the invention is not limited thereto. Those having ordinary skill in the art and access to the teachings provided herein will recognize additional modifications, applications and embodiments within the scope thereof and additional fields in which the present invention would be of significant utility.

2. Description of the Related Art

A voltage controlled oscillator (VCO) is an oscillator having an output frequency that is a function of the input voltage. Voltage controlled crystal oscillators are used in many applications. For example, in a radar application, voltage controlled crystal oscillators are used to provide a variable frequency output signal and to convert radar target return signals to specific frequencies. Conversion of the radar target return signals to specific frequencies provides for optimum filtering and target detection. Thus, the more accurate the specific frequency setting by the voltage controlled crystal oscillator within the radar receiver, the less time is required for target acquisition.

In addition to frequency accuracy, phase noise is another significant parameter of voltage controlled oscillators. Phase noise is a measure of purity of the signal. Phase noise arises from random fluctuations in the frequency produced by the oscillator and manifests itself as an inaccuracy or jitter on the oscillator output signal frequency. Phase noise is often detected by a radar receiver to the exclusion of weak returns. As a result, weak signals are often not detected by the radar system. Thus, the lower the phase noise of the voltage controlled crystal oscillator, the higher the probability that the system will be able to detect, acquire and track a target.

Voltage controlled crystal oscillators typically utilize analog control signals. Unfortunately, crystal oscillators employing analog control signals offer limited output frequency accuracy and are beset with higher phase noise relative to more current approaches.

Another technique currently employed to provide digitally controlled oscillator signals is known as direct digital synthesis (DDS). The DDS technique overcomes many of the problems associated with voltage controlled crystal oscillators by utilizing a digital control signal. The digital control signal allows for accurate setting of the output signal frequency. Further, the phase noise generated by the DDS technique is lower than that generated by a typical voltage controlled crystal oscillator.

The DDS system includes a digital section, a digital-to-analog converter section and an output analog section. The digital information provided to the digital-to-analog section represents the instantaneous amplitude of an RF (radio frequency) waveform. The function of the digital section is to generate a sinusoidally oscillating digital number. First, a frequency number is digitally defined and then digitally integrated in a counter to provide instantaneous digital phase information. Finally, the digital phase information is converted to a digital amplitude word by a look-up table stored in a Read-Only-Memory (ROM).

Unfortunately, the DDS technique suffers from several undesirable limitations which include high component expense and complexity, high power consumption, and output signals having a high spurious content (spectral purity). Typically, it is desirable for the oscillator to generate a single frequency signal. A signal having a high spurious content is one that includes frequencies other than the desired frequency. The additional spurious signal frequencies are detected by the radar receiver as phantom targets. The radar receiver thereafter tracks the phantom targets. An output signal having a high spurious level is to be distinguished from an output signal having high phase noise. A high phase noise signal complicates the detection of weak signals, while a signal with a high spurious level results in an undesirable tracking of a phantom target. Both problems contribute to poor performance of the radar system.

Thus, there is a need in the art for an improvement in digitally controlled crystal oscillators employed in radar tracking systems.

SUMMARY OF THE INVENTION

The need in the art is addressed by the digitally controlled crystal oscillator of the present invention. The invention includes a first oscillator circuit for providing an oscillator signal of a defined frequency and a digital divider for dividing the oscillator signal by a selectable number controlled by a digital word for providing a clock signal. A second oscillator circuit receives the clock signal and provides a low frequency signal. The second oscillator circuit includes a digitally controlled resonator element for determining the frequency of the low frequency signal and has a center frequency dependent upon the clock signal frequency. Circuitry is included for providing first and second pairs of quadrature phase shifted signals derived from the clock signal and the low frequency signal and from the oscillator signal of defined frequency, respectively. Finally, a mixer is provided for mixing the first and second pairs of quadrature phase shifted signals for providing a single high frequency output signal which varies in accordance with the digital control word.

In a preferred embodiment, a crystal oscillator provides a low noise signal which is operated upon by a divider controlled by a digital word for providing a clock signal which controls the center frequency of a plurality of bandpass filters. The filters function as a resonating element of a low frequency oscillator which provides a low frequency signal. Both the digitally controlled clock and low frequency signals and the low noise oscillator signal are utilized to provide two sets of quadrature phase shifted signals which are mixed for providing a single digitally controlled output signal.

DESCRIPTION OF THE INVENTION

Figure 1:
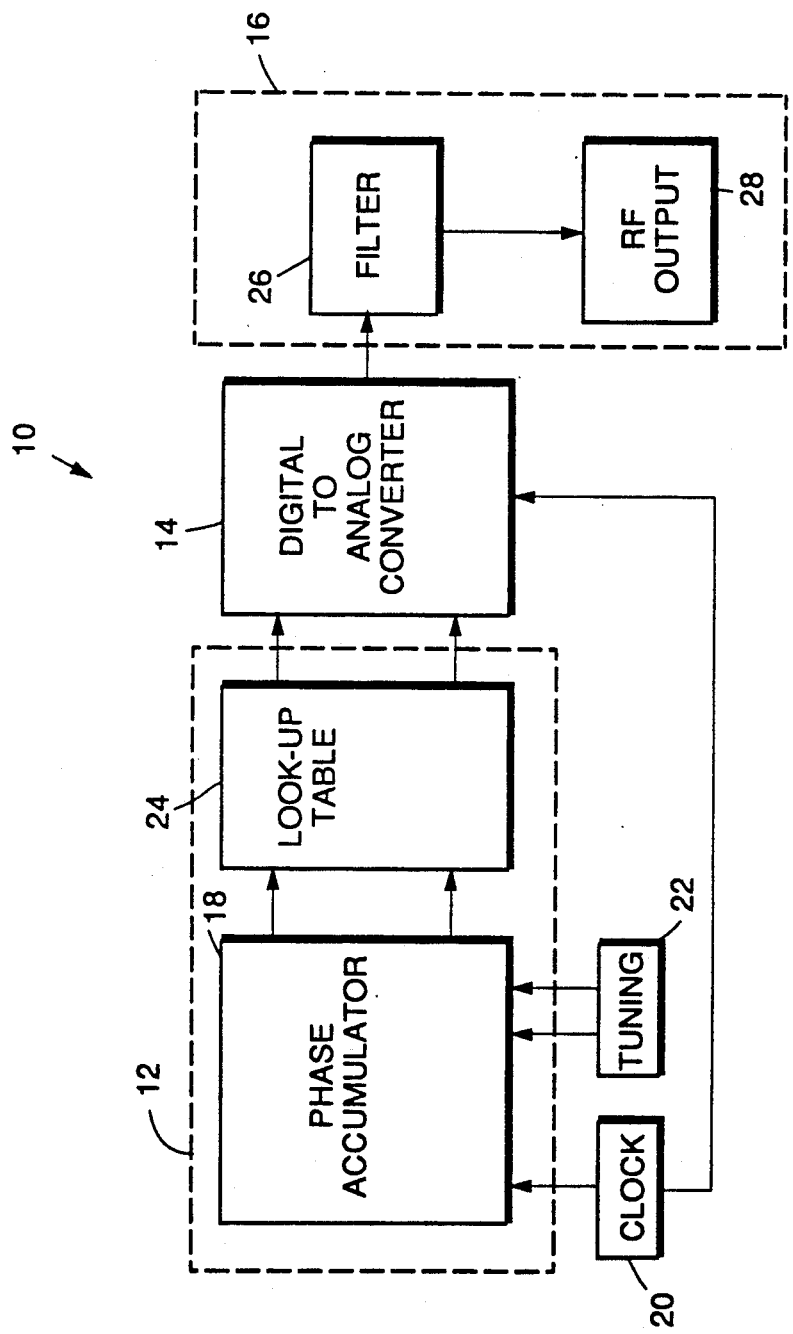
FIG. 1 is a simplified block diagram of a digitally controlled crystal oscillator of the prior art illustrating the direct digital synthesis technique.

Digitally controlled oscillators are known in the art. One such oscillator utilizes a direct digital synthesis (DDS) technique for providing digital controlled signals. A block diagram illustrating a conventional DDS control circuit 10 is shown in FIG. 1. The conventional DDS control circuit includes a digital section 12, a digital-to-analog converter section 14 and an output analog section 16. The function of the digital section 12 is to generate a sinusoidally oscillating digital number. The sinusoidally oscillating digital number, which represents the instantaneous amplitude of an RF (radio frequency) waveform, is then provided to the digital-to-analog converter (DAC) section 14. The digital section 12 includes a counter or phase accumulator 18 which accumulates changes in phase for each clock cycle. The phase accumulator 18 receives input signals from a timing clock 20 and a tuning circuit 22. The DAC 14 also receives timing signals from the timing clock 20.

Clock pulses are counted or integrated in the accumulator 18 to provide digital words which serve as addresses to values stored in the look-up table 24. The output of the look-up table 24 provides digital phase information which is converted to an analog signal by the DAC 14. An RF output signal is then taken from an RF output terminal 28 connected to the filter 26. Amplitude resolution is determined by the resolution of the DAC 14. The bandwidth of the filter 26 determines the settling time in conventional DDS systems. Unfortunately, DDS systems are generally complex and expensive, consume much power and provide output signals of low spectral purity.

Figure 2:
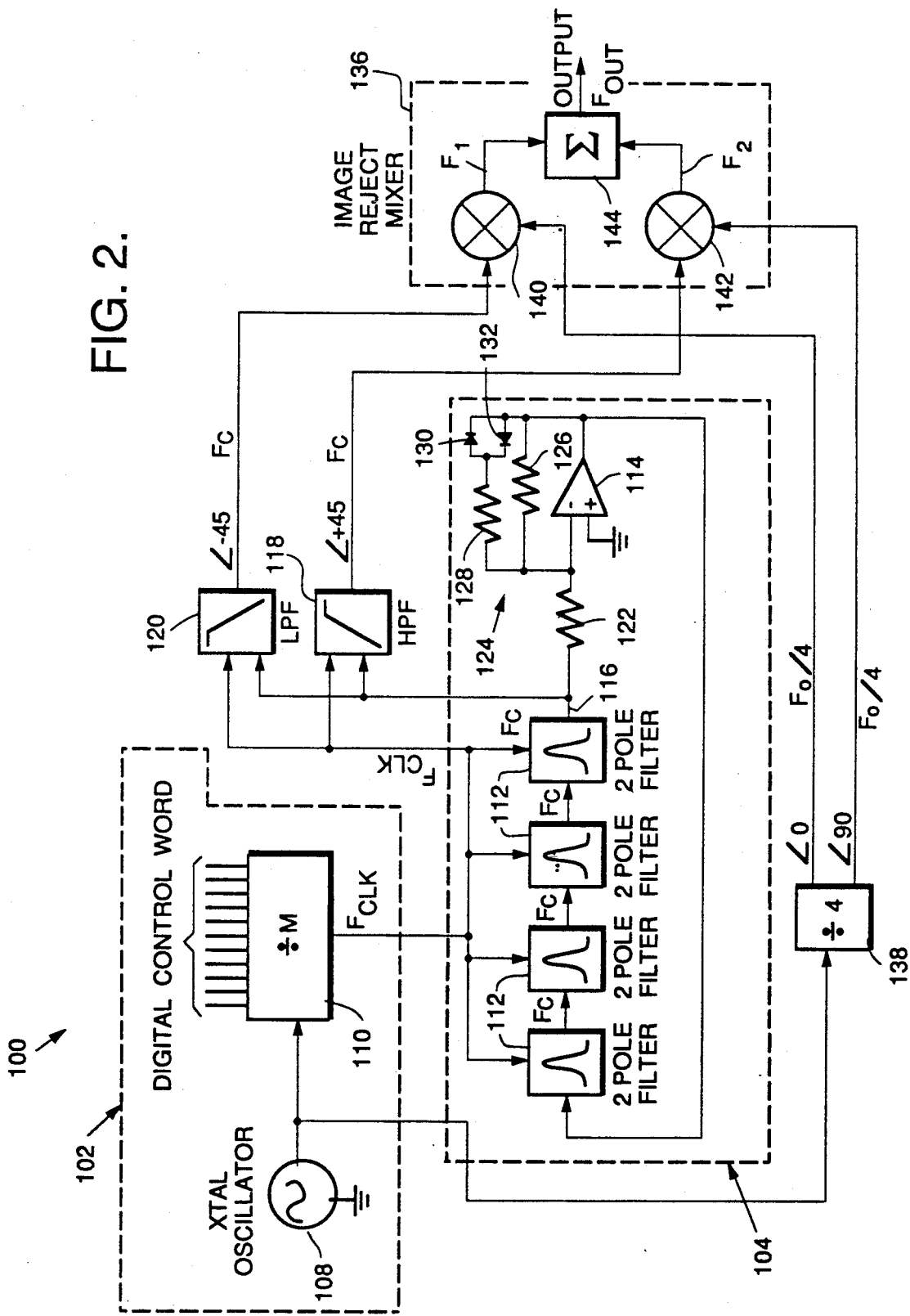
FIG. 2 is a circuit diagram of an illustrative embodiment of a digitally controlled crystal oscillator and method of the present invention.

These shortcomings are addressed by the digitally controlled crystal oscillator 100 of present invention which, as shown in FIG. 2, includes a digital control circuit 102. The control circuit 102 provides a clock signal $F_{clk}$. The invention 100 includes a low frequency oscillator 104 having a center frequency $F_c$ controlled by the clock signal $F_{clk}$. The output signal frequency $F_{out}$ of the crystal oscillator 100 is accurately set and varied by a digital control word provided by the control circuit 102.

More specifically, in accordance with the present teachings, the digital control circuit 102 and the low frequency oscillator 104 cooperate to provide a pair of digitally controlled signals $F_{clk}$ and $F_c$ respectively. These signals are used to provide a first set of quadrature phase signals and are mixed with a second set of quadrature phase signals for providing a single high frequency output signal $F_{out}$ that can be accurately set and controlled with the digital control word.

A crystal oscillator 108 located within the digital control circuit 102 provides an oscillator signal of defined fixed frequency $F_o$ having low phase noise (i.e., high spectral purity). A conventional crystal oscillator providing a fixed output signal $F_o$ of, for example, fifty megahertz would be utilized in the preferred embodiment. A programmable digital divider 110 such as a divide-by-M divider receives and divides the low phase noise oscillator signal $F_o$ by a selectable number "M". The selectable number "M" is input by the digital control word of the digital control circuit 102. The digital control word is typically provided by an external source such as a computer.

The output signal of the programmable digital divider 110 is the clock signal $F_{clk}$. The signal $F_{clk}$ is input to the low frequency oscillator 104. The low frequency oscillator 104 includes a block of cascaded second order switched capacitor bandpass filters 112. The block of bandpass filters 112 functions as a digitally controlled resonating element which, when utilized in conjunction with a limiting amplifier 114, forms the low frequency oscillator 104. The center frequency $F_c$ of the resonating element, e.g., the bandpass filters 112, is a linear function of the applied clock signal frequency $F_{clk}$. Since the clock frequency $F_{clk}$ is varied by the digital control word and the center frequency $F_c$ is a linear function of $F_{clk}$, then $F_c$ and thus the low frequency oscillator 104 are also varied by the digital control word.

In the preferred embodiment, the two-pole bandpass filters 112 are implemented as large scale integrated switched capacitors. The center frequency $F_c$ of the filters 112 is the frequency at which the filters resonate. The resonating bandpass filters 112, controlled by the digital clock signal $F_{clk}$, determines and controls the output frequency of the low frequency oscillator 104. Therefore, the function of the low frequency oscillator 104 is to provide a variable and controllable low frequency signal. The low frequency signal provided at an output terminal 116 of the block of bandpass filters 112 is at the center frequency $F_c$ of the filters and is a very pure sine wave. The low frequency signal $F_c$ is transmitted from the output terminal 116 to the limiting amplifier 114 and to a pair of switched capacitor filters 118 and 120 as shown in FIG. 2.

The block of resonating bandpass filters 112 control the low frequency signal $F_c$ of the low frequency oscillator 104. Since $F_{clk}$ controls the center frequency $F_c$ of the bandpass filters 112 and since $F_{clk}$ is controlled by the digital control word, the net and advantageous result is that the low frequency signal $F_c$ of the low frequency oscillator 104 is controlled by the digital control word.

The limiting amplifier 114 is connected to the output terminal 116 of the block of bandpass filters 112 through an input resistor 122 for providing gain to the low frequency signal $F_c$. The limiting amplifier 114 can be, for example, an operational amplifier as shown in FIG. 2. Because of the inherent characteristics of the low frequency oscillator 104, the gain of the low frequency signal $F_c$ must be limited to permit the resonating bandpass filters 112 and the oscillator 104 to function properly. Therefore, the limiting amplifier 114 includes a feedback network 124 to limit the gain of amplifier 114. The feedback network 124 comprises parallel feedback paths having a resistor 126 in one parallel path and a resistor 128 in series with a set of parallel opposing diodes 130, 132 in the second parallel path. The parallel opposing diodes 130, 132 provide a feedback path during both half cycles of the low frequency signal $F_c$.

Each of the switched capacitor filters 118 and 120 receive the clock signal $F_{clk}$ from the digital divider 110 and the low frequency signal $F_c$ from the output terminal 116 of the bandpass filters 112. Thus, the input signals to the switched capacitor filters 118 and 120 are both controlled either directly or indirectly by the digital control word. The low frequency signal $F_c$ is phase shifted through the two switched capacitor filters 118 and 120 to form two equal amplitude quadrature signals $F_c$ having phase angles of +45 degrees and −45 degrees, respectively. The first switched capacitor filter 118 is a high pass filter having an amplitude and an output phase angle of +45 degrees while the second switched capacitor filter 120 is a low pass filter having an equal amplitude and an output phase angle of −45 degrees.

The switched capacitor filters 118 and 120 which are each controlled by the clock signal $F_{clk}$ provide two equal amplitude signals $F_c$ that are ninety degrees out of phase. Two sets of equal amplitude quadrature signals are required as input signals to an image reject mixer 136 as described herein below. The second set of equal amplitude quadrature phase shifted signals is provided to the image reject mixer 136 by a divide-by-four digital quadrature divider 138 as shown in FIG. 2. The quadrature divider 138 receives the oscillator signal $F_o$ from the crystal oscillator 108 and delivers a pair of equal amplitude quadrature phase-shifted signals at the divider output terminal. The amplitude of each signal is divided by four providing equal amplitudes of $F_o/4$ having quadrature phase angles of zero degrees and +90 degrees. The two sets of quadrature phase shifted signals (e.g., four signals) including $F_c$ at +45 degrees, $F_c$ at −45 degrees, $F_o/4$ at zero degrees and $F_o/4$ at +90 degrees are then applied to the image reject mixer 136.

The image reject mixer 136 functions to mix the two sets of quadrature phase shifted signals to provide an output frequency signal comprised of the sum and difference of the input quadrature phase shifted signals. The image reject mixer 136 includes a first mixer 140, a second mixer 142 and a summer circuit 144 as shown in FIG. 2. The first mixer 140 receives the quadrature phase shifted signals $F_c$ at −45 degrees and $F_o/4$ at zero degrees and provides a first mixer output signal $F_1$ in accordance with the following equation:

$$F_1 = [(F_o/4 + F_c) + (F_o/4 - F_c)] \quad [1]$$

The second mixer 142 receives the quadrature phase shifted signals $F_c$ at +45 degrees and $F_o/4$ at +90 degrees and provides a second mixer output signal $F_2$ in accordance with the following equation:

$$F_2 = [(F_o/4 + F_c) - (F_o/4 - F_c)] \quad [2]$$

Each of the first and second mixer output signals $F_1$ and $F_2$ are transmitted to the summer circuit 144 which provides the single high frequency output signal $F_{out}$. The summer circuit 144 performs a vector addition of the mixer output signals $F_1$ and $F_2$ to determine $F_{out}$ as follows:

$$F_{out} = (F_o/4 + F_c) \quad [3]$$

The term $(F_o/4 + F_c)$ represents the frequency of the output signal of the digitally controlled crystal oscillator 100. Note that the frequency component $F_o/4$ is non-variable since it is derived from the fixed frequency oscillator signal $F_o$ of the crystal oscillator 108. Note further that $F_c$, which is the center frequency of the block of bandpass filters 112 and also the low frequency signal generated by the low frequency oscillator 104, is dependent upon the clock signal $F_{clk}$. Since $F_{clk}$ is controlled by the digital control word, the output frequency $F_{out}$ of the crystal oscillator 100 is also controlled by the digital control word.

The output frequency $F_{out}$ of the digitally controlled crystal oscillator 100 can be varied in accurate small increments via the digital address to the programmable digital divider 110. Thus, the oscillator 100 can be very accurately controlled by the externally generated digital control word. Further, the oscillator 100 provides an output signal $F_{out}$ with low phase noise and low spurious output levels while utilizing less expensive components and consuming less power than conventional designs.

Thus, the present invention has been described herein with reference to a particular embodiment for a particular application. It is to be understood that the specific structure disclosed in the illustrative embodiment including the block of bandpass filters 112 and the limiting amplifier 114 forming the low frequency oscillator 104 is for exemplary purposes only. Further, use of the digitally controlled crystal oscillator 100 is not limited to radar receivers but may be employed in any suitable system requiring a digitally controlled output frequency signal. Those having ordinary skill in the art and access to the present teachings will recognize additional modifications, applications and embodiments within the scope thereof.

It is therefore intended by the appended claims to cover any and all such modifications, applications and embodiments within the scope of the present invention.

Accordingly,

What is claimed is:

1. A digitally controlled oscillator comprising:
   first oscillator means for providing an oscillator signal of a defined frequency;
   dividing means for dividing said oscillator signal by a selectable number controlled by a digital word for providing a clock signal;
   second oscillator means receiving said clock signal for providing a low frequency signal, said second oscillator means including a digitally controlled resonator means for determining the frequency of said low frequency signal and having a center frequency dependent upon said clock signal;
   means for providing first and second pairs of quadrature phase shifted signals derived from said clock signal and said low frequency signal and from said oscillator signal, respectively; and
   means for mixing said first and second pairs of quadrature phase shifted signals for providing a single high frequency output signal which varies in accordance with said digital word.

2. The oscillator of claim 1 wherein said first oscillator means is a crystal oscillator and said oscillator signal is a low phase noise signal.

3. The oscillator of claim 1 wherein said dividing means is a digital divider.

4. The oscillator of claim 1 wherein said digitally controlled resonator means comprises a plurality of switched capacitor bandpass filters.

5. The oscillator of claim 1 wherein said second oscillator means is a low frequency oscillator.

6. The oscillator of claim 1 wherein said second oscillator means includes means for limiting the gain of said low frequency signal.

7. The oscillator of claim 6 wherein said gain limiting means comprises an operational amplifier feed-back circuit.

8. The oscillator of claim 1 wherein said first and second pairs of quadrature phase shifted signals have first and second sets of phase angles, respectively.

9. The oscillator of claim 8 wherein said first set of phase angles of said first pair of quadrature phase shifted signals includes phase angles of −45 degrees and +45 degrees.

10. The oscillator of claim 8 wherein said second set of phase angles of said second pair of quadrature phase shifted signals includes phase angles of zero degrees and +90 degrees.

11. The oscillator of claim 1 wherein said means for providing said first pair of quadrature phase shifted signals comprises a low pass filter and a high pass filter.

12. The oscillator of claim 1 wherein said means for providing said second pair of quadrature phase shifted signals comprises a quadrature divider.

13. The oscillator of claim 1 wherein said mixing means comprises an image reject mixer.

14. The oscillator of claim 13 wherein said image reject mixer further includes a plurality of signal frequency mixers.

15. The oscillator of claim 13 wherein said image reject mixer further includes a summer circuit.

16. A digitally controlled oscillator for use in a radar receiver comprising:
  a crystal oscillator for providing an oscillator signal of a defined frequency;
  a digital divider for dividing said oscillator signal by a selectable number controlled by a digital word for providing a clock signal;
  a low frequency oscillator receiving said clock signal for providing a low frequency signal, said low frequency oscillator including a plurality of digitally controlled filter resonators for determining the frequency of said low frequency signal and having a center frequency dependent upon said clock signal;
  means for providing first and second pairs of quadrature phase shifted signals derived from said clock signal and said low frequency signal and from said oscillator signal, respectively; and
  an image reject mixer for mixing said first and second pairs of quadrature phase shifted signals for providing a single high frequency output signal which varies in accordance with said digital word.

17. The oscillator of claim 16 wherein said first means for providing a pair of quadrature phase shifted signals includes a pair of switched capacitor filters.

18. The oscillator of claim 16 wherein said second means for providing a pair of quadrature phase shifted signals includes a digital quadrature divider.

19. A method of operating a digitally controlled oscillator for use in a radar receiver, said method comprising the steps of:
  providing a first oscillator signal of a defined frequency;
  dividing said first oscillator signal by a selectable number controlled by a digital word for providing a clock signal;
  receiving said clock signal at a filtering element located within a low frequency oscillator for controlling the center frequency of said filtering element;
  resonating said filtering element at said center frequency for determining the output signal frequency of said low frequency oscillator, said center frequency being dependent upon said clock signal;
  providing first and second pairs of quadrature phase shifted signals derived from said clock signal and said low frequency oscillator output signal and from said first oscillator signal, respectively; and
  mixing said first and second pairs of quadrature phase shifted signals for providing a single high frequency output signal which varies in accordance with said digital word.

20. The method of claim 19 further including the step of limiting the gain of said low frequency oscillator output signal.

21. The method of claim 19 wherein the step of mixing said first and second pairs of quadrature phase shifted signals further includes the step of summing the sum and difference of said quadrature phase shifted signals for providing said single high frequency output signal.

* * * * *